United States Patent
Chery et al.

(10) Patent No.: US 9,112,178 B2
(45) Date of Patent: Aug. 18, 2015

(54) BACK-EMITTING OLED DEVICE

(71) Applicant: SAINT-GOBAIN GLASS FRANCE, Courbevoie (FR)

(72) Inventors: Vincent Chery, Paris (FR); Fabien Lienhart, San Diego, CA (US); Vincent Sauvinet, Grenoble (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/369,351

(22) PCT Filed: Dec. 28, 2012

(86) PCT No.: PCT/FR2012/053100
§ 371 (c)(1),
(2) Date: Jun. 27, 2014

(87) PCT Pub. No.: WO2013/098536
PCT Pub. Date: Jul. 4, 2013

(65) Prior Publication Data
US 2015/0041782 A1     Feb. 12, 2015

(30) Foreign Application Priority Data

Dec. 30, 2011   (FR) ...................................... 11 62590

(51) Int. Cl.
*H01L 27/32* (2006.01)
*H01L 51/52* (2006.01)

(52) U.S. Cl.
CPC ........ *H01L 51/5209* (2013.01); *H01L 27/3204* (2013.01); *H01L 51/5203* (2013.01);
(Continued)

(58) Field of Classification Search
CPC ............ H01L 27/3204; H01L 51/5203; H01L 51/5209; H01L 51/5212; H01L 51/5225; H01L 51/5228; H01L 51/5271
USPC .......................................................... 257/40
See application file for complete search history.

(56) References Cited

U.S. PATENT DOCUMENTS

| 6,693,296 B1 * | 2/2004 | Tyan ................................. 257/40 |
| 2005/0146267 A1 * | 7/2005 | Lee et al. ........................ 313/506 |
| 2008/0197371 A1 | 8/2008 | Ottermann |

FOREIGN PATENT DOCUMENTS

| EP | 1 536 492 | 6/2005 |
| EP | 2 267 818 | 12/2010 |

(Continued)

OTHER PUBLICATIONS

Jordan, R. H., et al., "Efficiency enhancement of microcavity organic light emitting diodes," Appl. Phys. Lett., vol. 69, No. 14, Sep. 30, 1996, pp. 1997-1999.

(Continued)

*Primary Examiner* — Daniel Shook
(74) *Attorney, Agent, or Firm* — Pillsbury Winthrop Shaw Pittman LLP

(57) ABSTRACT

An OLED device includes a transparent anode of given sheet resistance R1, a cathode of given sheet resistance R2, the ratio r=R2/R1 ranging from 0.1 to 5, a first anode electrical contact and a first cathode electrical contact which is offset from the anode electrical contact, for any point B1 of each anode contact, on defining a distance D1 between the point B1 and a point C1 of the contact surface which is closest to the point B1, and on defining a distance L1 between the point B1 and a point X1 of a second edge of the active zone opposite from the first edge, passing through C1, then the following criteria are defined:
if $0.1 \leq r<1.75$, then $20\%<D1/L1$,
if $1.75 \leq r<2.5$, then $20\%<D1/L1<90\%$,
or if $2.5 \leq r<3$, then $20\%<D1/L1<80\%$,
or else if $3 \leq r \leq 5$ then $20\%<D1/L1<70\%$,
and a reflector (6) covers the active zone (20).

15 Claims, 5 Drawing Sheets

Figure 1:
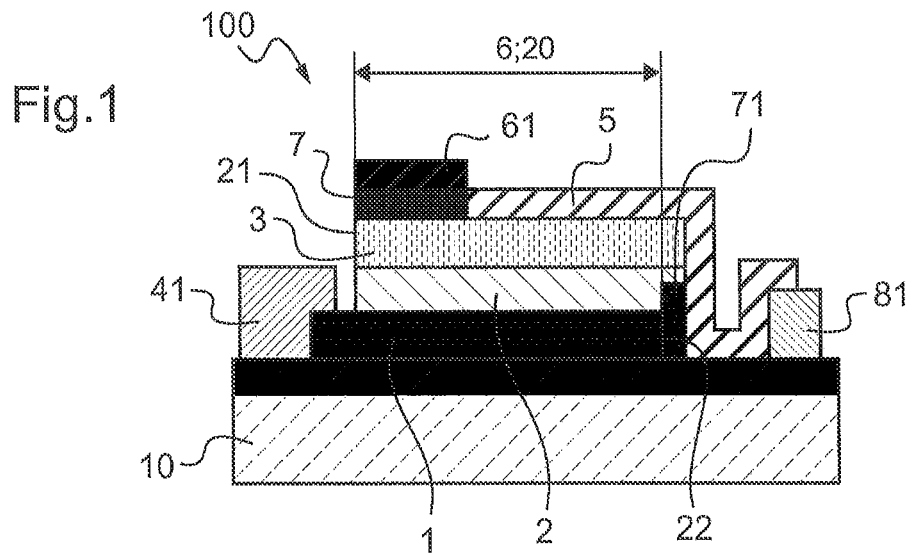

(52) U.S. Cl.
CPC ........ *H01L51/5225* (2013.01); *H01L 51/5228* (2013.01); *H01L 51/5271* (2013.01); *H01L 2251/533* (2013.01); *H01L 2251/5361* (2013.01)

(56) References Cited

FOREIGN PATENT DOCUMENTS

| WO | WO 99/02017 | 1/1999 |
| WO | WO 2008/029060 | 3/2008 |
| WO | WO 2009/083693 | 7/2009 |
| WO | WO 2010/109379 | 9/2010 |

OTHER PUBLICATIONS

Neyts, K., et al., "Semitransparent metal or distributed Bragg reflector for wide-viewing-angle organic light-emitting-diode microcavities," J. Opt. Soc. Am. B, vol. 17, No. 1, Jan. 2000, pp. 114-119.

International Search Report issued for International Application No. PCT/FR2012/053100, dated Apr. 19, 2013.

* cited by examiner

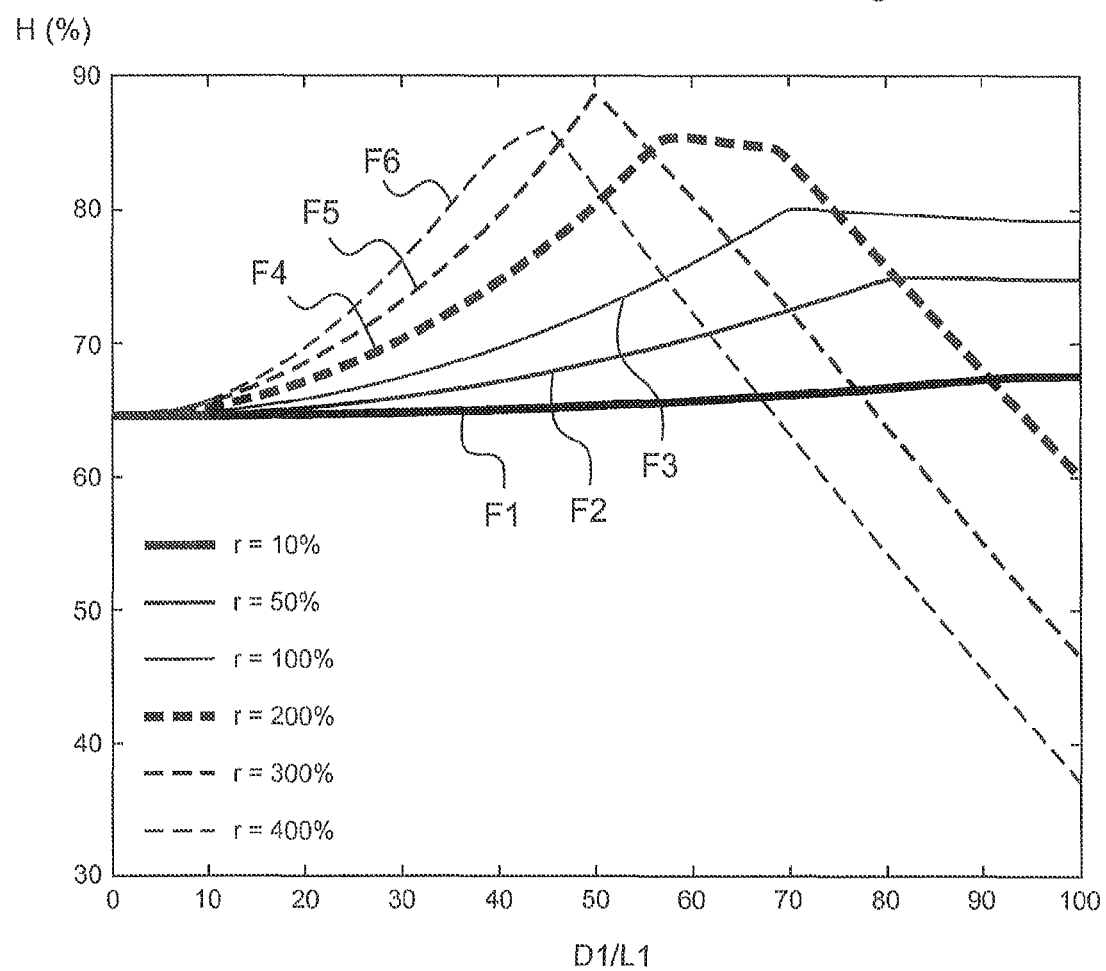

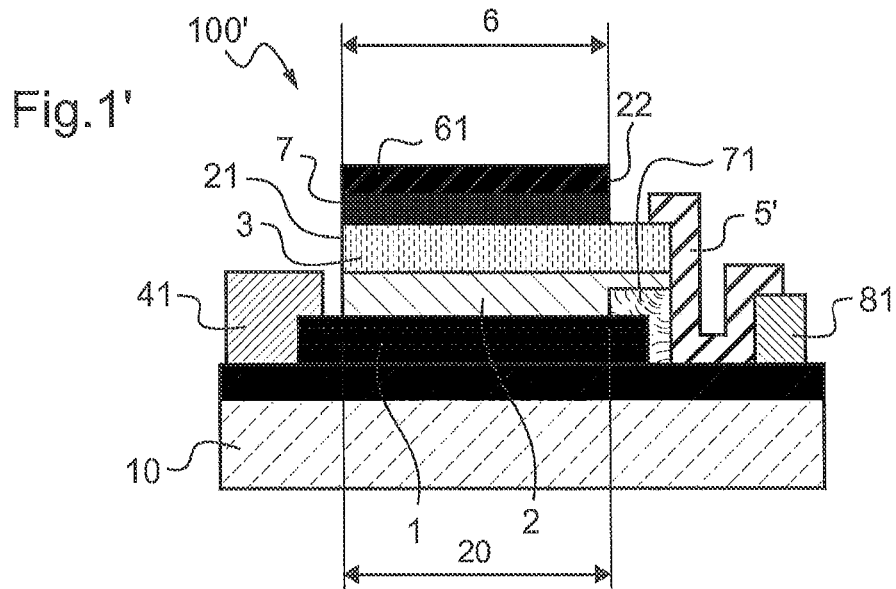
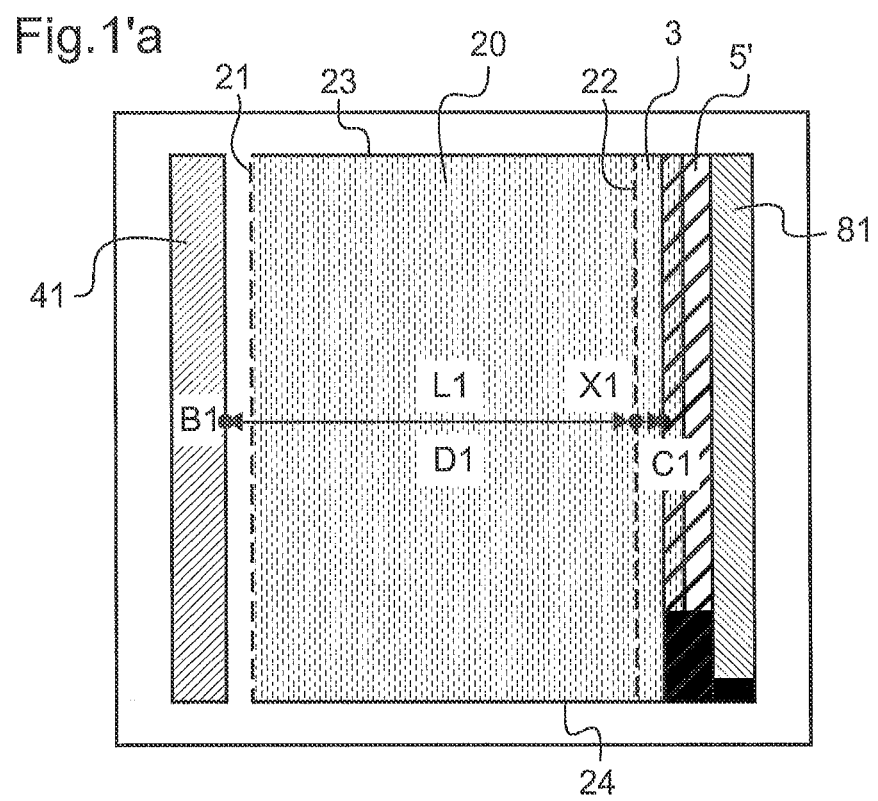

BACK-EMITTING OLED DEVICE

CROSS-REFERENCE TO RELATED APPLICATIONS

This application is the U.S. National Stage of PCT/FR2012/053100, filed Dec. 28, 2012, which in turn claims priority to French Application No. 1162590, filed Dec. 30, 2011. The contents of all of these applications are incorporated herein by reference in their entirety.

The subject of the present invention is a back-emitting organic light-emitting diode device.

Known organic light-emitting systems or OLEDs (for "Organic Light Emitting Diodes") comprise a stack of organic light-emitting layers supplied with electricity by electrodes bracketing it in the form of electroconducting thin layers. When a voltage is applied between the two electrodes, the electric current passes through the organic layer, thus generating light by electroluminescence.

In a back-emitting OLED device (or "bottom" OLED), the upper electrode, or cathode, is a reflecting metallic layer typically with sheet resistance of less than or equal to 0.1 Ω/square and the lower electrode or anode is a transparent layer, deposited on a glass or plastic substrate allowing the emitted light to pass through, of sheet resistance of several orders of magnitude higher.

Document WO99/02017 notes that a very large difference in sheet resistance between the anode and the cathode leads at one and the same time to an inhomogeneity in the luminance, a decrease in duration and in reliability, most particularly for large-size devices. Hence, it proposes an organic light-emitting diode device with a transparent anode of given sheet resistance $R_1$ and a cathode with a similar given sheet resistance $R_2$, the ratio $r=R_2/R_1$ lying between 0.3 and 3.

By way of example, the anode is a layer of ITO of sheet resistance 10 ohms and the cathode is a thin layer of ytterbium of sheet resistance 9.9 ohms i.e. r of around 1.

The gain in homogeneity is, however, not yet optimal and is not even certain for all OLED configurations.

Hence, the subject of the present invention is firstly a so-called OLED organic light-emitting diode device comprising a transparent substrate with a first main face comprising a stack comprising in this order, starting from said first face:
  (directly on the first face or on a sub-layer for example) a lower electrode forming an anode, which is transparent, preferably comprising at least one electroconducting layer, anode of given sheet resistance $R_1$, in particular $R_1$ less than 30 Ohm/square or indeed less than or equal to 15 Ohm/square or even 10 Ohm/square, the anode having a given anodic surface, the characteristic dimension of the anodic surface preferably being at least 2 cm, or indeed 5 cm,
  an organic light-emitting system above the anode,
  an upper electrode forming a cathode, above the organic light-emitting system (or indeed directly on the system), preferably comprising an electroconducting layer, cathode of given sheet resistance $R_2$, cathode preferably of constant given thickness, with a ratio $r=R_2/R_1$ ranging from 0.1 to 5
  the anode, the organic light-emitting system and the cathode thus defining a, so-called active, common zone (corresponding to the illuminating surface minus any optional inner anode contacts, if too opaque).
The OLED device furthermore comprises:
along a first edge of the active zone, along for example the whole of the first edge, or else along a group of adjacent edges (including the first edge), a first tailored anode electrical contact, or indeed several tailored anode electrical contacts, notably at the inner and/or outer periphery of the active zone,
  a first cathode electrical contact (preferably single), which is offset from the tailored anode electrical contact or contacts, cathode contact of given surface, termed the contact surface.

For (the majority or indeed 80% or at best for) any point $B_1$ of each tailored anode contact (in particular of the first tailored anode electrical contact), on defining a distance $D_1$ between said point $B_1$ and that point $C_1$ of the contact surface which is closest to said point $B_1$, and on defining a distance $L_1$ between said point $B_1$ and a point $X_1$ of a second edge of the active zone opposite from the first edge, passing through $C_1$, then the following criteria are defined:
  if $0.1 \leq r < 1.75$ then $20\% < D_1/L_1$,
  if $1.75 \leq r < 2.5$, then $20\% < D_1/L_1 < 90\%$, or
  if $2.5 \leq r < 3$, then $20\% < D_1/L_1 < 80\%$,
  or else if $3 \leq r \leq 5$, then $20\% < D_1/L_1 < 70\%$.

Finally, the OLED device comprises, above the organic light-emitting system, on moving away from the first face, a reflector covering the active zone.

Such a device is able to be connected in series through the layout of the cathode and anode contacts in particular.

The subject of the invention is also a so-called OLED organic light-emitting diode device comprising a transparent substrate with a first main face comprising a number n greater than 1 of stacks, each stack comprising in this order, starting from said first face:
  (directly on the first face or on a sub-layer for example) a lower electrode forming an anode, which is transparent, preferably comprising at least one electroconducting layer, anode of given sheet resistance $R_1$,
  an organic light-emitting system above the anode,
  an upper electrode forming a cathode, above the organic light-emitting system and preferably comprising an electroconducting layer, cathode of given sheet resistance $R_2$ preferably of constant given thickness, the ratio $r=R_2/R_1$ ranging from 0.1 to 5,
  the anode, the organic light-emitting system and the cathode thus defining a, so-called active, common zone,
  the stacks being connected in series, or able to be connected in series (through the layout of the cathode or anode contacts in particular etc.)
  and for at least one of the stacks, preferably for the majority or indeed each of the n stacks, the OLED device comprising:
  along a first edge of the active zone, a first tailored anode electrical contact or indeed several tailored anode electrical contacts,
  a first cathode electrical contact (preferably single), which is offset from the tailored anode electrical contact or contacts, cathode contact of given surface, termed the contact surface.

For (the majority or indeed 80% or at best for) any point $B_1$ of each tailored anode contact (in particular of the first tailored anode electrical contact), on defining a distance $D_1$ between said point $B_1$ and that point $C_1$ of the contact surface which is closest to said point $B_1$, and on defining a distance $L_1$ between said point $B_1$ and a point $X_1$ of a second edge of the active zone opposite from the first edge, passing through $C_1$, then the following criteria are defined:
  if $0.1 \leq r < 1.75$ then $20\% < D_1/L_1$,
  if $1.75 \leq r < 2.5$, then $20\% < D_1/L_1 < 90\%$, or
  if $2.5 \leq r < 3$, then $20\% < D_1/L_1 < 80\%$, or else
  if $3 \leq r \leq 5$, then $20\% < D_1/L_1 < 70\%$.

Finally, the OLED device comprises, above the organic light-emitting system, on moving away from the first face, a reflector covering the active zone.

Hence for $0.1 \leq r < 1.75$, if D1 is less than L1 (D1/L1<100%), the first cathode electrical contact is arranged above the active zone and then partially covers the region of the cathode above the active zone (extending as far as the second edge opposite from the first edge). If D1 is greater than or equal to L1, the first cathode electrical contact is arranged along the second edge at the outer periphery of the active zone (for example in a cathode zone protruding from the active zone).

For the other ranges of r, the first cathode electrical contact is then arranged above the active zone and then partially covers the region of the cathode above the active zone, (extending as far as the second edge opposite from the first edge).

More rigorously, D1 is the distance between B1 and the (orthogonal) projection of C1 onto the anode or better into the plane passing through B1 parallel to the anode, but having regard to the small height of the OLED, this does not change the criteria defined hereinabove.

And likewise more rigorously, L1 the distance between B1 and X1 (X1 in the plane passing through B1 parallel to the anode) on passing through the orthogonal projection of C in the plane passing through B1 parallel to the anode but having regard to the small height of the OLED, this does not change the criteria defined hereinabove.

It may therefore be preferred to define D1 and L1 in the plane passing through B1 parallel to the anode.

The transparent substrate may be monolithic (common for all or part of the stacks) or in several pieces (for example a support per stack, n supports being abutted to form the substrate).

According to the invention, "tailored anode contact" (that is to say the first tailored anode contact and also the other tailored anode contact(s)) is intended to mean an electrical contact having sufficient conduction such that, when the OLED is in operation, the voltage is the same at any point of the tailored contact. A result of this conduction property is that, between two points of the tailored contact, the variation in luminance in proximity to these two points is less than 5%. The role of the tailored anode contact is therefore to distribute one and the same electrical potential over the whole of its surface.

According to the invention, the first cathode electrical contact furthermore has a sufficient conduction so that, when the OLED is in operation, the voltage is the same at any point of the first cathode contact. A result of this conduction property is that, between two points of this cathode contact, the variation in luminance in proximity to these two points is less than 5%. The role of this cathode contact is therefore to distribute one and the same electrical potential over the whole of its surface.

The aim of this invention is to fabricate the largest possible OLED satisfying a criterion of prerequisite luminance homogeneity with an anode of given R1 and a given organic layer resistance rorg, in particular with a given configuration of anode contacts on a single edge or OLEDs in series.

The Applicant has noted that the positions of the connection arrangements for the anode and cathode, in particular their positioning with respect to one another, as well as their shapes were critical. For a genuine gain in homogeneity, it is thus crucial:

to choose the anode contact or contacts judiciously, in particular their position and their resistance (so that they are tailored), to place the first cathode contact correctly, and to distance the first cathode contact sufficiently from the tailored anode contact or contacts.

One thus obtains the most constant possible difference of potentials between the cathode and the anode over the whole of the illuminating surface.

D1 may be constant whatever the point B1 or vary while remaining with the ratio D1/L1 according to the invention which depends drastically on the choice of the ratio r.

The first cathode contact can extend in the active zone toward the edges of the active zone at least in the direction of the tailored anode contact or contacts.

The optional upper limit of D1/L1 recalls that the first cathode contact according to the invention then deviates from a contact of point-like type.

A cathode contact then leaving some of the central zone of the active zone inhomogeneous is not in accordance with the invention. It is possible to cite as counter-examples:

a cathode contact in several pieces which are spaced too far apart in the central zone of the active zone, a hollow cathode contact forming too fine a frame or annulus.

Another counter-example of cathode contact (not in accordance with the invention) would furthermore be a network of resistive or even tailored contacts, such as a grid or parallel bands, occupying just the inner periphery of the active zone (of width D1) or the whole of the active zone.

The first cathode contact according to the invention, in particular above the active zone, preferably is not a contact of point-like type.

The cathode contact according to the invention does not necessarily reproduce the symmetry of the active zone.

The contact surface can be a solid surface, a grid-like surface (designed to maintain an equipotential). The contact surface can be preferably a single surface (in one piece) and/or the cathode contact can be single.

The (substantially) solid contact surface (in particular a layer deposited on the anode) can exhibit surface discontinuities, but unable to disturb its function of equipotential.

And, as already indicated, preferably the solid contact surface is not of hollow type.

It is furthermore preferred that the active zone be of solid type.

The cathode contact can be self-supported and overlaid onto the cathode for example a set of wires, sheet-like, etc.

Preferably the thickness of the first cathode contact is constant.

The first tailored contact for its part may be a solid layer or mesh type layer (tight grid forming a band etc.), or indeed a set of point-like anode contacts sufficiently close together to distribute the current, for example less than a few mm apart.

The expression "along a first edge" should be interpreted in the wide sense, the tailored anode contact or contacts being able to follow the contour of the first edge (internally or in the phraseology "second edge opposite from the first edge" is taken in the wide sense and incorporates two opposite zones of a rounded active zone (disk, ovoid contour, etc).

The first tailored contact, in particular (substantially) rectilinear, may be peripheral, peripheral taken in the wide sense therefore:

at the periphery external to the first edge, covered by the light-emitting system (and by the cathode above) and is passivated by a passivation layer, such as polyimide, therefore (at least in part) at the inner periphery of the first edge.

The first outer peripheral tailored contact and/or the optional second outer peripheral tailored anode contact or contacts are preferably at a distance W of less than L/10 or indeed than L/20 from the first edge where L is the distance, preferably constant, between first and second edge.

Preferably the first tailored contact which is peripheral (like the optional second peripheral tailored anode contact or contacts) lies alongside (substantially) the periphery (inner or outer) of the first edge, and is a constant (or nearly so) distance from the periphery of the active zone.

The first peripheral tailored contact, outer and/or inner, is preferably at a distance of less than 10 mm, or indeed less than or equal to 5 mm from the first edge and or indeed is (in part) on the first edge of the active zone (protruding therefrom on either side).

The first or indeed the optional other peripheral tailored anode contacts of peripheral anode (outer and/or inner) are preferably at a distance (preferably constant) of less than 10 mm or indeed than 5 mm from the first edge, and or indeed are (in part) on the first edge of the active zone (protruding therefrom on either side).

The first tailored contact may be on or under the anode.

The first and/or the optional second tailored anode contact(s) (in particular peripheral) may substantially be rectilinear, be curved etc.

Typically the width of a tailored anode contact (extended or indeed point-like) is of the order of a cm. There is probably no light exiting in the active zone endowed with the first tailored anode contact, since the latter is too opaque.

Moreover, in contradistinction to the aforementioned prior art, an acceptable luminance level is safeguarded via the reflector according to the invention. Typically the reflector may have a luminous reflection $R_L$ (toward the organic system) of at least 80%.

The organic light-emitting system is above the anode:
in particular directly on the anode, by integrating into the anode function also an electroconducting optional planarization,
or else directly on a passivation of tailored anode contact internal to the active zone (as discussed later),
in particular directly on the anode, by integrating into the anode function also an electroconducting optional planarization,
or else directly on a passivation of resistive anode contact internal to the active zone (as discussed later).

Typically, the substrate clad with the anode (anode directly on the substrate or separated by a layer for example for the extraction of light) may have a luminous transmission of at least 70%.

According to the invention, "thin layer" is intended to mean a layer (mono or multilayer if not specified precisely) of thickness less than a micron, or indeed than 500 nm, or indeed than 100 nm.

According to the invention, "layer" is intended to mean a monolayer or multilayer, if not specified precisely.

The cathode is preferably of constant given thickness in particular with a tolerance as a function of the fabrication method, for example ±10% for a thin layer type deposition.

The OLED according to the invention most particularly intended for lighting also the characteristic dimension, i.e. the largest dimension, such as the length or the diameter, of the active zone may be at least 10 cm or indeed 15 cm.

The cathode being supplied electrically at a potential Vc, such that the difference of potential(s) between anode and cathode is suitable for lighting, in particular Vc is grounded.

It is considered that a conventional thick cathode is ideal, that is to say it forms by itself a cathode contact (equipotential at every point of the cathode). The invention is distinguished from such a cathode through the increase in the sheet resistance of the cathode R2 and criteria on the contact surface.

The cathode contact is above the active zone, in particular if $1.75 \leq r$ or the cathode contact may be outside the active zone if $r<1.75$.

Preferably, the first cathode contact which is above the active zone, may have a surface (substantially) homothetic to the surface of the active zone and/or be a (substantially) constant distance from the tailored anode contact in particular (substantially) parallel to the tailored anode contact.

If the active zone is a square or a rectangle, the cathode contact is a square or a rectangle or if the active zone is round, the first cathode contact, exhibits a rounded edge facing the first edge.

For still better homogenization, the following is preferred:
if $0.1 \leq r < 1.75$, then $40\% \leq D1/L1$, or indeed $60\% \leq D1/L1$,
if $1.75 \leq r < 2.5$, then $40\% \leq D1/L1 \leq 80\%$, or indeed $50\% \leq D1/L1 \leq 70\%$,
if $2.5 \leq r < 3$, then $40\% \leq D1/L1 \leq 70\%$, or indeed $40\% \leq D1/L1 \leq 60\%$,
if $3 \leq r \leq 5$, then $30\% \leq D1/L1 \leq 50\%$.

The OLED device may comprise one or more so-called resistive anode electrical contacts, in particular as an electroconducting layer, linked to the first tailored anode contact and/or to the optional tailored anode contact(s), optionally interconnected resistive contacts, contacts of larger resistance than the resistance of the tailored anode contact or contacts.

And the ratio r=R2/R1 ranging from 0.1 to 5 is then replaced with a ratio r'=R2/R1' ranging 0.1 to 5, in which R1' is the equivalent sheet resistance of the anode/resistive contact(s) assembly in the active zone and the ratios D1/L1 are retained.

Naturally the following will be preferred:
if $0.1 \leq r' < 1.75$, then $40\% \leq D1/L1$, or indeed $60\% \leq D1/L1$,
if $1.75 \leq r' < 2.5$, then $40\% \leq D1/L1 \leq 80\%$, or indeed $50\% \leq D1/L1 \leq 70\%$,
if $2.5 \leq r' < 3$, then $40\% \leq D1/L1 \leq 70\%$, or indeed $40\% \leq D1/L1 \leq 60\%$,
if $3 \leq r' \leq 5$ then $30\% \leq D1/L1 \leq 50\%$.

The resistive contacts are of resistance such that during operation, certain points of the resistive contact are at a potential Vr distinct from the potential of the tailored anode contact by more than 5% as an absolute relation, or indeed at least 10% or even 20%.

The overall resistance of the anode may thus be defined as the placing of the resistance of the resistive contacts in parallel with the resistance of the transparent anode layer.

The resistive contact may be of one and the same material as the tailored contact but much finer for example less than 1 mm.

For esthetic purposes, an OLED device may be preferred which is divested of one or more tailored anode contacts in the active zone, or indeed divested of one or more resistive anode contacts (even if fairly fine in general) in the active zone.

An anode contact (tailored or resistive) may be in the form of a layer of thicknesses lying between 0.2 to 10 µm and preferably in the form of a monolayer of one of the following metals: Mo, Al, Cr, Nb or an alloy such as MoCr, AlNb or in the form of a multilayer such as Mo/Al/Mo or Cr/Al/Cr.

It may also be a silk-screen-printed silver-based bus bar (silver enamel) or one deposited by ink jet.

It is already known to reduce R1 of the anode by a fairly fine mesh of resistive electrical contacts, typically a square metallic network or honeycomb on the anode.

The strands are of the order of 50 to 100 µm wide and the pitch of the network is in general 1/5 mm, thus giving an occlusion factor of between 1 and 5%.

R1' can vary from 0.5 to 5 Ohms for example. In practice, use is made of a multilayer Mo or Cr (100 nm)/Al (500 nm to 1000 nm)/Mo or Cr (100 nm) is deposited for example on the ITO of 140 nm. This multilayer is thereafter chemically etched, with a photolithography method in general, to form the resistive contacts and optionally the tailored anode contacts in the same substance but wider.

Thus, at the anode level, everything happens as if there were an anode of resistance equivalent to placing the anode and the resistive anode contact or contacts in parallel.

There is then a voltage in the resistive anode contacts which will decrease progressively on moving away from the edges of the OLED.

In the same manner, there may be one or more cathode resistive contacts, for example as an electroconducting layer, linked to the first cathode contact, resistive contacts optionally interconnected and in particular distributed over the whole of the zone between the first cathode contact and the edges of the OLED.

In this case, R2 corresponds to the equivalent sheet resistance of the cathode and resistive contact(s) assembly.

The resistive contacts are for example of resistance such that during operation, certain points of the resistive contact are at a potential Vr distinct from the potential of the first cathode contact V by more than 2% as an absolute relation, or indeed at least 4% or even 8%.

The first tailored anode contact may be an extended contact, in particular single or the first tailored anode contact is a contact of point-like type, and other tailored anode contacts of point-like type are distributed over the first edge.

The first edge and the second edge are preferably the longitudinal edges (the longest) of the active zone. It is preferred that there are no tailored anode contacts on the edges adjacent to the first and to the second edge. It is preferred that the tailored anode contact or contacts extend over (at least) a first edge over a distance of less than a half of the active zone.

For an active zone of square type or a rectangle, it is preferred that the tailored anode contact or contacts extend over a single edge preferably the longest.

If the cathode contact is external, its shape matters less. Preferably it is in proximity (or indeed is in contact with the second edge) and lies alongside the second edge.

For a round active zone, the anode contact and the cathode contact are of parenthesis type if the cathode contact is external. Or the anode contact is C-shaped and the inner cathode contact is C-shaped, in particular a constant distance from the C of the anode contact.

This avoids an active zone shape of triangle type, the first and second edges being "too" adjacent. An active zone of symmetric type is preferred.

The active zone or zones can form square or rectangular bands, (substantially) rectilinear, parallel or curved bands.

In the case of n stacks, the active zones are for example aligned along at least one given so-called connection direction A, or else extend according to another shape such as a sun etc.

The active zones of the n stacks, in particular solid, are preferably of similar sizes, in particular equal to a surface area S±10% and preferably the active zones are of similar shapes. The distance between the first edge and the second edge is preferably (substantially) constant, for example equals a value G±10%.

The spacing between the active zones is preferably minimized to under 500 μm, in particular between 100 and 500 μm.

Between the active zones, it is possible to prolong the reflector.

In the off state, it is possible to arrange matters such that the reflector forms a mirror on the whole set of n stacks (therefore without discontinuities).

The active zones are preferably geometric shapes, tilings (rectangle, square, honeycomb etc.).

Moreover, on account of the tailoring of R2, the cathode can be transparent or semi-reflecting, in particular of reflection RL less than 80%, or indeed less than or equal to 60%, or indeed 50%.

The cathode allows the emitted light to pass through, preferably without absorbing too much.

In a first configuration (with the transparent or semi-transparent cathode), the reflector can comprise a reflecting covering element preferably metallic, in particular (thin) layer(s), above the cathode on moving away from the first main face, the covering element being separated from the cathode by an electrical insulating element, in particular layer-like, a so-called insert.

The first cathode contact, adjacent to the insert, can also form part of the reflector and is preferably in contact or indeed electrically coupled with the reflecting covering element.

The reflecting covering element may be:
 a layer, deposited by physical vapor phase deposition on the insert, or on an inner face of a counter-element (glass, plastic film etc.) overlaid against the insert (in optical contact preferably)
 a metallic sheet: Cu, stainless steel, Alu, Ag etc.

The reflecting covering element, preferably layer-like, is based on at least one metal chosen from among Al, Ag, Cu, Mo, Cr.

The insert can be chosen to allow the emitted light to pass through, preferably without absorbing too much. For example the insert is transparent, preferably of TL>90%, and quite non-absorbent in particular A<3%.

The insert may be:
 a layer deposited on the thin layer cathode deposited by physical vapor phase deposition, or indeed a glue if the reflector is a plate (stainless steel etc) etc.
 air, the reflector being separated by spacers, peripheral to the active zone,
 an overlaid film, for example a lamination insert (PVB type) and the reflector is for example a glass substrate with a reflecting layer.

The insert preferably comprises or indeed consists of a (mono)layer (in particular of thickness less than 100 nm, thickness adjusted as a function of its absorption) which is
 mineral, preferably chosen from among a nitride, an oxide, an oxynitride, for example a silicon nitride,
 or a resin for example identical to the resin for passivating the OLED edges, in particular of polyimide,
 and/or optionally is diffusing for example by addition of diffusing particles, in particular mineral, in a binder, in particular mineral.

Preferably, in this first configuration, the first cathode contact comprises a layer based on the same material as the metallic covering element, preferably which is a layer based on aluminum.

The cathode contact may be:
 a layer deposited on the cathode: conducting glue, layer deposited by ink jet or silk-screen printing according to the form desired, thin layer deposited by PVD and if necessary patterned, a soldered joint or indeed a weld etc.
 and/or an overlaid film with the predetermined form: foil leaf etc.

The cathode contact, preferably layer-like, is based on at least one metal preferably chosen from among Al, Ag, Cu, Mo, Cr.

In particular, the cathode contact and the covering element may be formed by a continuous layer, in particular on the insert (layer-like) and the cathode. Preferably the cathode contact, and indeed the continuous layer, is based on the same material as the cathode, in particular aluminum.

In this manner in the off state, the continuous layer can form a mirror and the cathode contact is not differentiated from the covering element.

It may be desired to use a single deposition technique (for example physical vapor phase PVD, in particular cathodic sputtering or evaporation) for the covering element and the cathode contact (and even the cathode or else the insert), or indeed even a single step of layer deposition for the covering element and the cathode contact.

More broadly, among the possible materials for the cathode may be cited metals: aluminum, beryllium, magnesium, calcium, strontium, barium, lanthanum, hafnium, indium, bismuth, and lanthanides: cerium, praseodymium, neodymium, samarium, europium, gadolinium, terbium, dysprosium, holmium, erbium, thulium, ytterbium, and lutetium.

Preferred in particular are aluminum, silver, barium, calcium, samarium which are often used for their low work function.

Table 1 hereinbelow gives the R2 of the aluminum (which may be transparent or semi-transparent as a function of the chosen thickness), the R2 of the samarium, of resistivity (per unit mass) 900 nOhm·m, which may be transparent or semi-transparent as a function of the chosen thickness and the R2 of the barium, of resistivity (per unit mass) 332 nOhm·m, which is transparent or semi-transparent as a function of the chosen thickness.

TABLE 1

| Thickness (nm) | R2 ($\Omega/\square$) for Al | Thickness (nm) | R2 ($\Omega/\square$) for Ba | Thickness (nm) | R2 ($\Omega/\square$) for Sm |
|---|---|---|---|---|---|
| 10 | 5 | 5 | 66 | 10 | 90 |
| 20 | 2.5 | 10 | 33 | 50 | 18 |
| 50 | 1 | 30 | 11 | 100 | 9 |
| 100 | 0.5 | 50 | 6 | 200 | 4.5 |
| 200 | 0.25 | 75 | 4 | | |
| 500 | 0.1 | 100 | 3 | | |

It is preferred that R2 be greater than or equal to 1 or indeed than 3 ohm/square and less than 20 ohm/square.

In a preferred manner, the cathode is based on at least one metal, preferably chosen from among Al and Ag, with optionally a layer of LiF subjacent to the metal layer and for example less than 3 nm in thickness.

Most particularly the cathode can comprise, or indeed is constituted, of a layer based on aluminum and the cathode contact is a layer based on aluminum, forming for example a thickening on the aluminum cathode layer.

In a second configuration (with the transparent or semi-transparent cathode), the reflector is a Bragg mirror, Bragg mirror arranged on the cathode and adjacent to the cathode contact, and the cathode contact forms part of the reflector.

The Bragg mirror is known as a stack formed of an alternation of thin layers of high refractive index n1, such as TiO2, ZrO2, Al2O3, Si3N4, and of thin layers of lower index n2, such as SiO2, CaF2.

For example the delta of index n2−n1 is at least 0.3, and preferably at least 0.6, and the stack comprises at least two high-index layers and two low-index layers.

Thus, for an OLED of wavelength centered near 570 nm, it will be possible to envisage a multilayer stack TiO2 60 nm/SiO2 95 nm, or indeed optionally the superposition of this multilayer stack.

The use of Bragg mirrors for OLEDs is well known to the person skilled in the art, who will optionally be able to refer to the following publications:

Appl. Phys. Lett. 69, 1997 (1996); Efficiency enhancement of microcavity organic light emitting diodes; R. H. Jordan, A. Dodabalapur, and R. E. Slusher JOSA B, Vol. 17, Issue 1, pp. 114-119 (2000), Semitransparent metal or distributed Bragg reflector for wide-viewing-angle organic light-emitting-diode microcavities; Kristiaan Neyts, Patrick De Visschere, David K. Fork, and Greg B. Anderson.

The cathode contact may touch the Bragg mirror.

The cathode contact is connected for example by one of its ends protruding from the active zone then forming a cathode connection arrangement zone.

The invention will now be described in greater detail with the aid of nonlimiting examples and of figures.

Figure 1A:
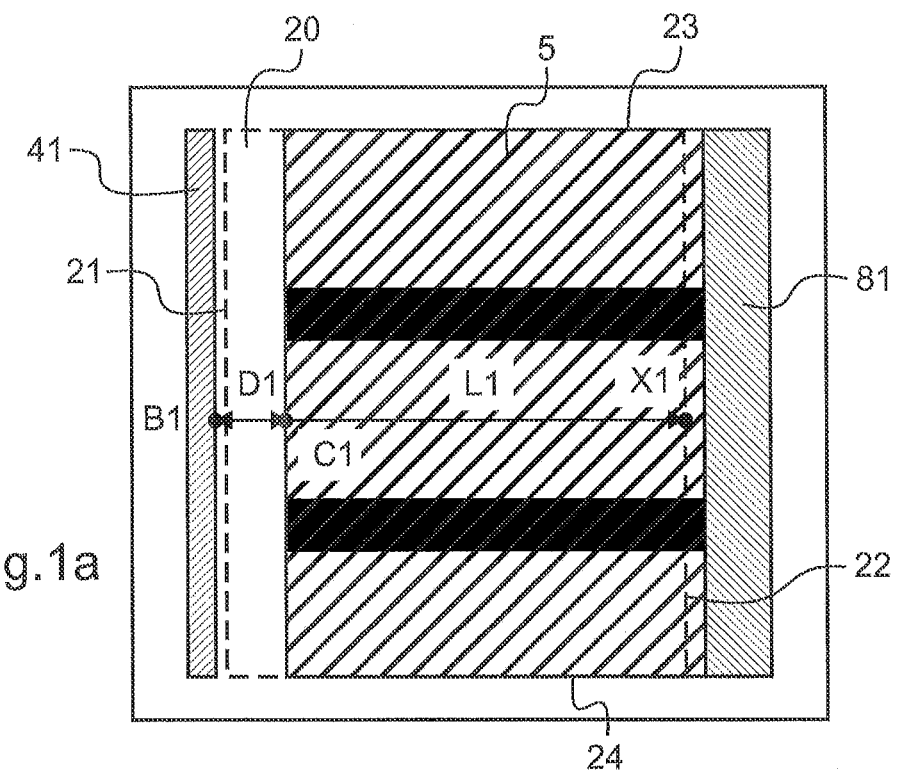
Figure 2:
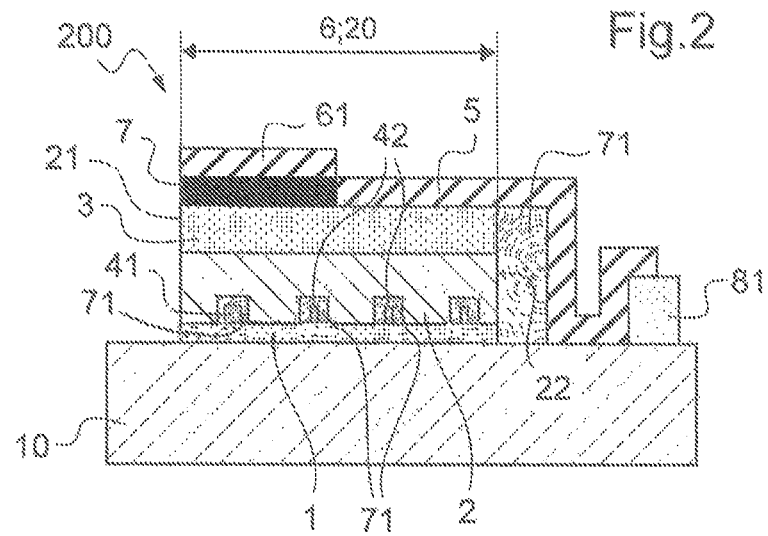
Figure 2A:
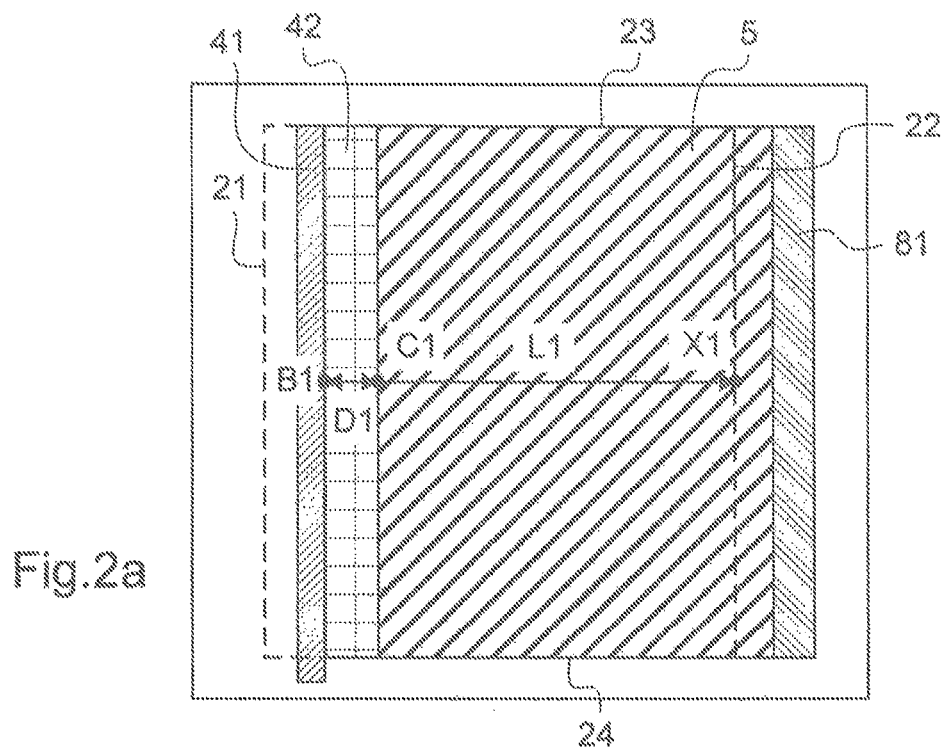
Figure 3:
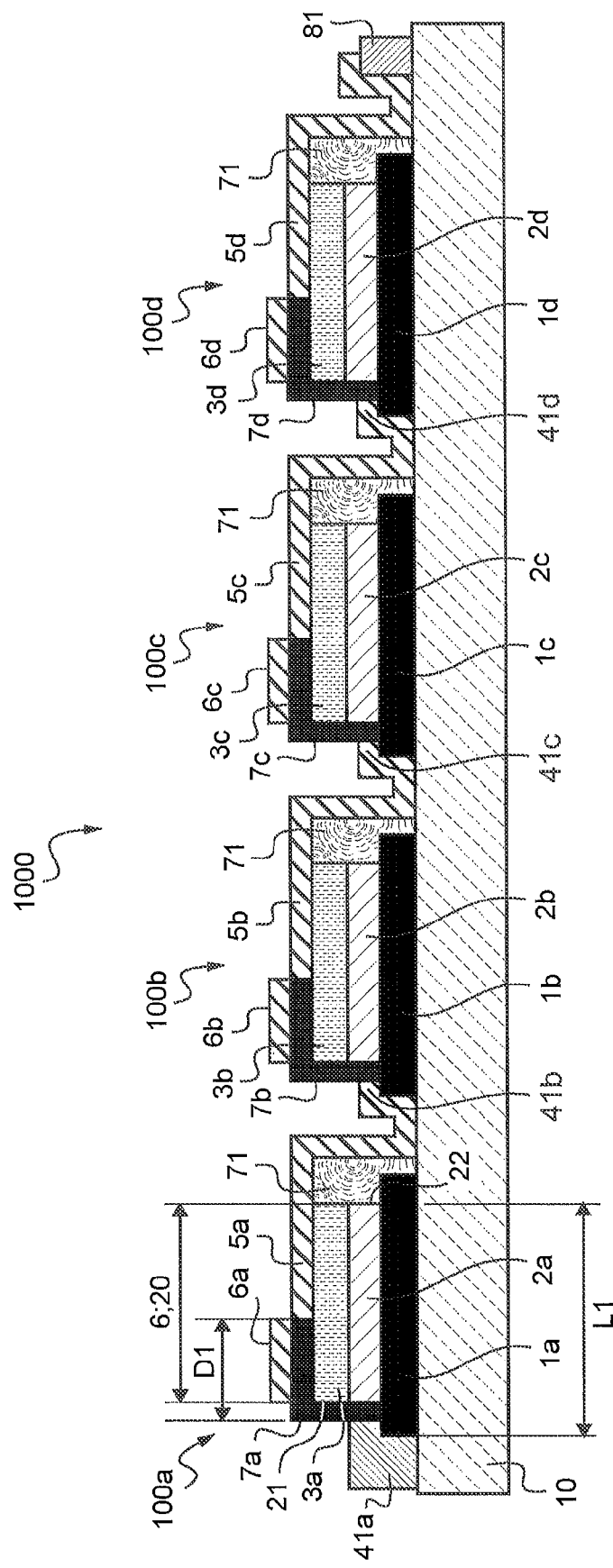

FIG. 1 is a sectional schematic view of a first organic light-emitting device in accordance with the invention, FIG. 1a illustrates a schematic view from above of the OLED device of FIG. 1, FIG. 1b shows luminance homogeneity graphs obtained according to the invention, FIG. 1' is a sectional schematic view of a second organic light-emitting device in accordance with the invention, FIG. 1'a illustrates a schematic view from above of the OLED device of FIG. 1', FIG. 2 is a sectional schematic view of a third organic light-emitting device in accordance with the invention, FIG. 2a illustrates a partial schematic view from above of the OLED device of FIG. 2, FIG. 3 is a sectional schematic view of a fourth OLED device in accordance with the invention with 4 stacks connected in series.

It is specified that for the sake of clarity the various elements of the objects (including the angles) represented are not reproduced to scale.

FIG. 1, intentionally very schematic, represents in section an organic light-emitting device with emission through the substrate or "bottom emission".

The OLED device 100 (readily connectable in series) comprises a transparent substrate with a first main face 10 comprising a stack comprising in this order, starting from said first face:

a lower electrode forming an anode 1, which is transparent, comprising at least one electroconducting layer, anode of given sheet resistance R1, for example a TCO or a silver-based stack, an organic light-emitting system 2 above the anode, (including layer HTL and ETL), an upper electrode forming a cathode 3, transparent or semi-reflecting, above the organic light-emitting system, comprising an electroconducting layer, cathode of given sheet resistance R2 of constant given thickness, the ratio r=R2/R1 ranging from 0.1 to 5, the stack thus defining a, so-called active, common zone 20.

A potential V, for example 4V or 10 V, is applied at the boundary of the anode 1 via a first peripheral anode electrical contact 41, metallic (multi)layers for example. It is termed the first tailored anode contact 41, that is to say of electrical resistance tailored so as to be, during operation, at the first potential V at every point.

The first tailored contact 41 is here outside the active zone 20 on a first longitudinal edge 21 of the active zone.

The invention thus consists of an OLED module of which both the ratio r and the geometry of the electrical connections on the two electrodes are adjusted in such a way that the voltage drops which take place in the two electrodes compensate one another so as to maintain the most uniform possible voltage difference between the two electrodes.

For any point B1 of the first tailored anode contact 41, on defining a distance D1 between said point B1 and that point C1 of the contact surface which is closest to said point B, and on defining a distance L1 between said point B1 and a point X1 of a second longitudinal edge 22 of the active zone opposite from the first edge 21, passing through C1, then the following criteria are defined:

if $0.1 \leq r < 1.75$, then $20\% < D1/L1$,
if $1.75 \leq r < 2.5$, then $20\% < D1/L1 < 90\%$,
if $2.5 \leq r < 3$, then $20\% < D1/L1 < 80\%$,
if $3 \leq r \leq 5$, then $20\% < D1/L1 < 70\%$,
And better still
if $0.1 \leq r < 1.75$ then $40\% \leq D1/L1$, or indeed $60\% \leq D1/L1$, or indeed even $70\% \leq D1/L1$
if $1.75 \leq r < 2.5$, then $40\% \leq D1/L1 \leq 80\%$, or indeed $50\% \leq D1/L1 \leq 70\%$,
if $2.5 \leq r < 3$, then $40\% \leq D1/L1 \leq 70\%$, or indeed $40\% \leq D1/L1 \leq 60\%$,
if $3 \leq r \leq 5$, then $30\% \leq D1/L1 \leq 50\%$ The contact surface 5 is here a solid surface, as a variant it is grid-like.

A reflector 6 comprises a metallic reflecting covering element 61, above the cathode 3 on moving away from the first main face, the covering element 61 being separated from the cathode 3 by an electrically insulating electrical element 7, a so-called insert, transparent and quite non-absorbent, here a layer preferably mineral and thin, such as 50 nm of silicon nitride.

The first cathode contact 5, adjacent to the insert 7, is reflecting, therefore forms part of the reflector 6 and is preferably in contact or indeed electrically coupled with the reflecting covering element 61.

The cathode contact 5 is preferably based on the same material as the metallic covering element 61. The cathode contact 5 and the covering reflector 6 are then formed by a continuous layer on the insert 7 and the cathode 3 for example by physical vapor phase deposition. Preferably this continuous layer is based on aluminum for example 100 nm, or indeed of 500 nm in thickness. Naturally the insert 7 has been structured before the deposition so as to leave a free zone corresponding to the zone intended to be the zone of the cathode contact.

The second edge 22 of the active zone 20 is for example passivated by polyimide resin for example 71.

The anode contact 41 is here on the anode 1 deposited previously on the substrate (or on a subjacent layer). However, the anode 2 may equally well be deposited after the anode contact 41 and overlap it partially for its electrical bonding.

As a variant, not represented, the reflector comprises a Bragg mirror adjacent to said first cathode contact. The, reflecting, cathode contact then still forms part of the reflector. The Bragg mirror (of dielectric materials) may be directly on the cathode.

The cathode 3 is for example an aluminum layer, in particular of R2 greater than or equal to 1 ohm/square, or indeed greater than or equal to 3 ohm/square and less than 20 ohm/square or indeed than 10 ohm/square, the cathode contact is then preferably a layer based on aluminum, as already indicated.

The active zone 20 is for example at least 5 cm by 5 cm.

The cathode contact is extended outside of the active zone beyond the second edge 22 and for example is deposited on a pre-existing contact pad 81.

The OLED device 100 comprises above the organic light-emitting system 2, on moving away from the first face 10, a reflector 6 covering the active zone 20.

FIG. 1a illustrates a schematic view from above of the device 100 showing a part of the elements of the device for greater clarity, namely the elements with electrical function.

The first tailored anode contact 41 is a rectilinear band. The active zone 20 (defined here simply by its contours, dashed), is likewise square.

The edges 23, 24 of the active zone which are adjacent to the first and second edges 21, 22 are not provided with tailored anode contacts.

By way of illustration, we have plotted a point B1 of the anode contact 41, the closest point C1 belonging to the cathode contact 5 (here internal) and the point X1 of the second edge 22 (in the plane of B1 parallel to the anode). The straight line passing through B1, through the orthogonal projection of C1 in the plane of B1 parallel to the anode and passing through X1, makes it possible to best define L1 and D1.

Practically the space between the first tailored contact 21 and the first edge 21 is restricted. The first outer peripheral tailored contact is preferably at a distance W of less than L/10 or indeed than L/20 from the first edge where L is the distance here constant between first and second edges 21 and 22 (equal to L1).

We choose L=15 cm, Rorg=1000 Ohm·cm², an anode of 3 Ohm/square, and the homogeneity H of the luminance is defined as the ratio between the minimum luminance over the maximum luminance for an OLED supplied at a given voltage above the OLED turn-on voltage.

FIG. 1b shows the graphs of homogeneity H as a function of D1/L1 of the cathode contact 5 of the device 100 shown in FIG. 1, for various ratios r (between 0.1 and 4).

Depicted therein are six curves F1 to F6 of homogeneity H (in %) respectively for r=0.1; r=0.5; r=1; r=2; r=3; r=4.

These graphs F1 to F6 recall the suitable parameter spans, in particular toward low values of r, the optimal span is narrower but H is better.

The results for H are similar (follow the same trend) with a different Rorg, typically between 50 and 1000 Ohm·cm², an anode of different R1 typically between 1 and 10 ohm per square, and for any other size of active zone.

We choose for example r=3 and D/L=50% with an ITO anode of R1=8 Ohm per square and a cathode of R2=24 Ohm per square; or else a silver-based anode of R1=3 Ohm per square and a cathode of R2=9 Ohm per square.

It is also possible to choose a lower r, for ease of fabrication, for example with r=1 and D/L=70%=>with an ITO anode of R1=8 Ohm per square and a cathode of R2=8 Ohm per square; or else a silver-based anode of R1=3 Ohm— cathode of R2=3 Ohm per square.

To produce an anode of R1 equal to 3 ohm per square, a silver-based stack is preferred to a transparent conducting oxide "TCO" such as ITO. It is possible to cite for example the silver-based monolayer or silver-based bilayer stacks described in applications WO 2008/029060 and WO 2009/083693.

To produce the cathode, aluminum is deposited while adjusting the thickness.

FIG. 1' is a sectional schematic view of a second organic light-emitting device 100' in accordance with the invention.

We have chosen a fairly low r, for example with r=1 and 100%<D/L. Stated otherwise the insert 7 and the covering element 61 cover the whole of the active zone 20 and the cathode contact 5' is shifted to the periphery of the second edge 22 in a zone of the cathode 3 protruding from the active zone 20.

The cathode contact 5' may be in contact with the covering element 61 for example forming a continuous layer in the active zone and beyond.

FIG. 1'a illustrates a schematic view from above of the device 100' showing a part of the elements of the device for greater clarity, namely the elements with electrical function.

The first tailored anode contact 41 is a rectilinear band. The active zone 20 (defined here simply by its contours, dashed), is rectangular.

The edges 23 and 24 of the active zone which are adjacent to the first and second edges 21, 22 are not provided with tailored anode contacts.

Practically the space between the first tailored contact and the first edge 21 is restricted. The first outer peripheral tailored contact is preferably at a distance W of less than L/10 or indeed than L/20 from the first edge where L is the distance between first and second edges 21, 22.

By way of illustration we have plotted a point B1 of the anode contact 41, the point C1 closest to the cathode contact 5 (here external) and the point X1 of the second edge 22 (in the plane of B1 parallel to the anode). The straight line passing through B1, through the orthogonal projection of C1 in the plane of B1 parallel to the anode and passing through X1, makes it possible to best define L1 and D1.

We choose L=15 cm, Rorg=1000 Ohm·cm$^2$, an anode of 3 Ohm/square, and the homogeneity H of the luminance is defined as the ratio between the minimum luminance over the maximum luminance for an OLED supplied at a given voltage above the OLED turn-on voltage.

FIG. 2 is a sectional schematic view of a second organic light-emitting device 100' in accordance with the invention in a variant of the first device 100. FIG. 2a illustrates a partial schematic view from above of the OLED device of FIG. 2.

Resistive anode electrical contacts 42 are added, as an electroconducting layer linked to the first tailored anode contact 41. Here these resistive contacts 42 are interconnected and form a grid on the anode (or as a variant underneath) and passivated by a resin 71.

Hence to obtain good homogeneity of illumination, the ratio r is replaced with a ratio r'=R2/R'1 in which R'1 is the equivalent sheet resistance of the anode/resistive anode contact(s) assembly, that is to say the placing in parallel of the anode and of the resistive anode contacts.

The resistive anode contact 42 may be made of one and the same material as the tailored contact 41 but much finer for example of under 1 mm. For example, a square mesh of metallic strands of a period of 5 mm, produced with the aid of aluminum wires 500 nm in height and 100 μm in width forms a system having an equivalent sheet resistance of 2.7 ohm per square. If such a mesh is placed on an ITO anode of sheet resistance 20 ohm per square, the equivalent resistance of the anode (defined as the resistance resulting from the placing in parallel of the anode and of the resistive contacts), is then 2.4 ohm per square. By producing on this anode an OLED of square active zone of 8×8 cm$^2$, having a vertical resistance of the organic materials of 100 ohm·cm$^2$, the illumination will be in proximity to a resistive contact situated 4 cm from the edge of the OLED 20% lower. This illumination decrease of greater than 5% is attributed to the resistive character of the resistive contacts which bring about a decrease in the voltage of the anode at the center of the OLED, bringing about the drop in illumination.

Another difference with respect to the first device is that the first anode contact 41 lies alongside the first edge 21 in the active zone 20 and not outside. Also, it is passivated by a resin 71. It protrudes from the edge 24 (adjacent to the first edge 21) for its electrical connection.

FIG. 3 is a sectional schematic view of a third organic light-emitting device 1000 in accordance with the invention.

In fact the OLED device comprises four OLED devices 100a to 100b of the type of the first device 100, therefore four stacks defining four active zones 20a to 20d and connected in series along a direction A.

Naturally the cathode contact pad 81 is displaced onto the last edge of the last stack 20d. Furthermore the first cathode contact 5a overhangs from the first active zone 20a and serves as anode contact 41b of the second anode 2b and so on and so forth.

Here there is a single substrate 10, but it is also possible to use four supports with the OLEDs abutted together.

The active zones, preferably identical, are rectilinear bands or indeed curved bands and of constant width.

It is preferred to minimize the non-reflecting zones between each device 100a to 100d.

It is also possible to produce OLEDS in series with the device of type 100' or 200. It is also possible to produce OLEDS in series with round or similar active zones.

The invention claimed is:

1. An organic light-emitting diode device, comprising:
a transparent substrate with a first main face comprising a stack comprising in this order, starting from said first main face:
a lower electrode forming an anode, which is transparent, the anode having a resistance R1,
an organic light-emitting system above the anode,
an upper electrode forming a cathode arranged above the organic light-emitting system, the cathode having a sheet resistance R2, the ratio r=R2/R1 ranging from 0.1 to 5, the anode, the organic light-emitting system and the cathode defining an active, common zone,
along a first edge of the active common zone, a first anode electrical contact,
a first cathode electrical contact which is offset from the first anode electrical contact, the first cathode electrical contact having a contact surface, and
above the organic light-emitting system, away from the first main face, a reflector covering the active zone,
wherein, for any point B1 of the first anode electrical contact, on defining a distance D1 between said point B1 and a point C1 of the contact surface which is closest to said point B1, and on defining a distance L1 between said point B1 and a point X1 of a second edge of the active common zone opposite from the first edge, passing through C1, then the following criteria are defined:
if 0.1≤r<1.75, then 20%<D1/L1,
if 1.75≤r<2.5, then 20%<D1/L1<90%,
or if 2.5≤r<3, then 20%<D1/L1<80%,
or else if 3≤r<5 then 20%<D1/L1<70%.

2. The organic light-emitting diode device as claimed in claim 1, wherein the contact surface is a solid surface, or a grid-like surface.

3. The organic light-emitting diode device as claimed in claim 1, wherein the first cathode electrical contact is above the active common zone if 1.75≤r or the first cathode electrical contact is outside the active if r<1.75.

4. The organic light-emitting diode device as claimed in claim 1, wherein the cathode contact is above the active common zone and exhibits a surface substantially homothetic to the surface of the active common zone and is a substantially constant distance from the first anode electrical contact.

5. The organic light-emitting diode device as claimed in claim 1, wherein the first cathode electrical contact is above the active common zone and is a substantially constant distance from the first anode electrical contact.

6. The organic light-emitting diode device as claimed in claim 1, wherein:
if $0.1 \leq r < 1.75$, then $40\% \leq D1/L1$,
if $1.75 \leq r < 2.5$, then $40\% \leq D1/L1 \leq 80\%$,
if $2.5 \leq r < 3$, then $40\% \leq D1/L1 \leq 70\%$,
if $3 \leq r < 5$, then $30\% \leq D1/L1 \leq 50\%$.

7. The organic light-emitting diode device as claimed in claim 1, wherein resistive anode electrical contacts, contacts of larger resistance than the resistance of the first anode electrical contact, are linked to the first anode electrical contact, and wherein the ratio r lying between 0.1 and 5 is replaced with a ratio $r'=R2/R1'$ ranging from between 0.1 to 5 in which $R1'$ is the equivalent sheet resistance of the assembly of anode and resistive anode electrical contacts.

8. The organic light-emitting diode device as claimed in claim 1, wherein the first edge and the second edge are longitudinal edges of the active common zone.

9. The organic light-emitting diode device as claimed in claim 1, wherein the cathode is transparent or semi-reflecting, wherein the reflector comprises a reflecting covering element above the cathode away from the first main face, the reflecting covering element being separated from the cathode by an insert electrical insulating element, and wherein the first cathode electrical contact, adjacent to the insert forms part of the reflector and is in contact or electrically coupled with the reflecting covering element.

10. The organic light-emitting diode device as claimed in claim 9, wherein the first cathode electrical contact is based on the same material as the reflecting covering element, and the first cathode electrical contact and the reflecting covering element are formed by a continuous layer, and the first cathode electrical contact is based on the same material as the cathode.

11. The organic light-emitting diode device as claimed in claim 10, wherein the continuous layer is based on the same material as the cathode.

12. The organic light-emitting diode device as claimed in claim 1, wherein the cathode comprises a layer based on aluminum and the first cathode electrical contact comprises a layer based on aluminum.

13. The organic light-emitting diode device as claimed in claim 1, wherein the reflector comprises a Bragg mirror, adjacent to the first cathode electrical contact, and the first cathode electrical contact forms part of the reflector.

14. An organic light-emitting diode device, comprising:
a transparent substrate with a first main face comprising a number n greater than 1 of stacks, each stack comprising in this order, starting from said first main face:
a lower electrode forming an anode, which is transparent, the anode having a sheet resistance R1,
an organic light-emitting system above the anode,
an upper electrode forming a cathode arranged above the organic light-emitting system, the cathode having a sheet resistance R2, the ratio $r=R2/R1$ ranging from 0.1 to 5, the anode, the organic light-emitting system and the cathode thus defining an active, common zone,
the stacks being connected in series, connectable in series and for at least one of the stacks, the organic light-emitting diode device comprises:
along a first edge of the active common zone, a first anode electrical contact,
a first cathode electrical contact, which is offset from the first anode electrical contact, the first cathode electrical contact having a contact surface,
wherein, for any point B1 of the first anode electrical contact, on defining a distance D1 between said point B1 and a point C1 of the contact surface which is closest to said point B1, and on defining a distance L1 between said point B1 and a point X1 of a second edge of the active common zone opposite from the first edge, passing through C1, then the following criteria are defined:
if $0.1 \leq r < 1.75$, then $20\% < D1/L1$,
if $1.75 \leq r < 2.5$, then $20\% < D1/L1 < 90\%$,
if $2.5 \leq r < 3$, then $20\% < D1/L1 < 80\%$,
if $3 \leq r < 5$, then $20\% < D1/L1 < 70\%$.

15. The organic light-emitting diode device as claimed in claim 14, wherein the active zones of several of the n stacks are of similar sizes.

* * * * *